(12) United States Patent  (10) Patent No.: US 8,256,660 B2
Lee et al.  (45) Date of Patent: *Sep. 4, 2012

(54) SEMICONDUCTOR PACKAGE SYSTEM WITH FINE PITCH LEAD FINGERS AND METHOD OF MANUFACTURING THEREOF

(75) Inventors: Hun Teak Lee, Ichon (KR); Jong Kook Kim, Suwon (KR); ChulSik Kim, Ichon-si (KR); Ki Youn Jang, Ichon-si (KR)

(73) Assignee: STATS ChipPAC Ltd., Singapore (SG)

( * ) Notice: Subject to any disclaimer, the term of this patent is extended or adjusted under 35 U.S.C. 154(b) by 0 days.

This patent is subject to a terminal disclaimer.

(21) Appl. No.: 13/053,141

(22) Filed: Mar. 21, 2011

(65) Prior Publication Data

US 2011/0169149 A1  Jul. 14, 2011

Related U.S. Application Data

(60) Continuation of application No. 12/767,670, filed on Apr. 26, 2010, now Pat. No. 7,909,233, which is a division of application No. 11/162,617, filed on Sep. 16, 2005, now Pat. No. 7,731,078.

(60) Provisional application No. 60/627,900, filed on Nov. 13, 2004.

(51) Int. Cl.
*B23K 31/00* (2006.01)
*H01L 23/48* (2006.01)

(52) U.S. Cl. .............. 228/180.5; 228/4.5; 257/784

(58) Field of Classification Search .............. 228/180.5, 228/1.1, 4.5, 175, 178; 257/734, 696, 676, 257/673, 784, 667, E23.024; 438/123, 612
See application file for complete search history.

(56) References Cited

U.S. PATENT DOCUMENTS

| | | | |
|---|---|---|---|
| 4,521,476 A | 6/1985 | Asai et al. | |
| 4,742,023 A | 5/1988 | Hasegawa | |
| 5,007,576 A | 4/1991 | Congleton et al. | |
| 5,101,263 A * | 3/1992 | Kitano et al. | 257/734 |
| 5,328,079 A | 7/1994 | Mathew et al. | |
| 5,329,157 A | 7/1994 | Rosotker | |
| 5,340,770 A | 8/1994 | Allman et al. | |
| 5,444,303 A | 8/1995 | Greenwood et al. | |
| 5,465,899 A | 11/1995 | Quick et al. | |
| 5,545,922 A * | 8/1996 | Golwalkar et al. | 257/676 |
| 5,561,086 A | 10/1996 | Rostoker | |
| 5,578,981 A | 11/1996 | Tokuda | |
| 5,654,585 A | 8/1997 | Nishikawa | |
| 5,686,762 A | 11/1997 | Langley | |
| 5,735,030 A * | 4/1998 | Orcutt | 29/860 |
| 5,904,288 A | 5/1999 | Humphrey | |
| 5,960,262 A | 9/1999 | Torres et al. | |
| 5,994,169 A | 11/1999 | Lamson et al. | |
| 6,114,239 A | 9/2000 | Lake et al. | |
| 6,158,647 A | 12/2000 | Chapman et al. | |

(Continued)

*Primary Examiner* — Roy King
*Assistant Examiner* — Michael Aboagye
(74) *Attorney, Agent, or Firm* — Ishimaru & Associates LLP; Mikio Ishimaru; Stanley M. Chang

(57) ABSTRACT

A semiconductor package system, and method of manufacturing thereof, includes: a die having a contact pad; a lead finger having a substantially trapezoidal cross-section; a bump clamped on a top and a side of the lead finger, the bump connected to the contact pad; and an encapsulant over the lead finger and the die, the encapsulant with a bottom of the lead finger exposed.

21 Claims, 4 Drawing Sheets

U.S. PATENT DOCUMENTS

| | | |
|---|---|---|
| 6,294,830 B1 | 9/2001 | Fjelstad |
| 6,329,278 B1 | 12/2001 | Low et al. |
| 6,420,256 B1 | 7/2002 | Ball |
| 6,462,414 B1 | 10/2002 | Anderson |
| 6,561,411 B2 | 5/2003 | Lee |
| 6,624,059 B2 * | 9/2003 | Ball ............................ 438/612 |
| 6,713,881 B2 | 3/2004 | Umehara et al. |
| 6,787,926 B2 | 9/2004 | Chen et al. |
| 6,815,836 B2 | 11/2004 | Ano |
| 6,849,931 B2 * | 2/2005 | Nakae ........................ 257/672 |
| 6,927,479 B2 | 8/2005 | Ramakrishna |
| 7,190,060 B1 | 3/2007 | Chiang |
| 7,731,078 B2 * | 6/2010 | Lee et al. .................. 228/180.5 |
| 7,909,233 B2 * | 3/2011 | Lee et al. .................. 228/180.5 |
| 2002/0105069 A1 | 8/2002 | Kawahara et al. |
| 2003/0089521 A1 | 5/2003 | Lee et al. |
| 2004/0152292 A1 | 8/2004 | Babinetz et al. |
| 2005/0133928 A1 | 6/2005 | Howard et al. |
| 2006/0049523 A1 | 3/2006 | Lin |
| 2006/0113665 A1 | 6/2006 | Lee et al. |

* cited by examiner

SEMICONDUCTOR PACKAGE SYSTEM WITH FINE PITCH LEAD FINGERS AND METHOD OF MANUFACTURING THEREOF

CROSS-REFERENCE TO RELATED APPLICATION(S)

This application is a continuation of U.S. patent application Ser. No. 12/767,670 filed Apr. 26, 2010, now U.S. Pat. No. 7,909,233, which is a divisional of U.S. patent application Ser. No. 11/162,617 filed Sep. 16, 2005, now U.S. Pat. No. 7,731,078, which claims the benefit of U.S. Provisional Patent Application Ser. No. 60/627,900 filed Nov. 13, 2004, and the subject matter thereof is hereby incorporated herein by reference thereto.

TECHNICAL FIELD

The present invention relates generally to semiconductor packages, and more particularly to a system for wire bonding die in a semiconductor package.

BACKGROUND ART

Integrated circuit dies conventionally are enclosed in semiconductor packages that provide protection from hostile environments and enable electrical interconnection between the integrated circuit die and an underlying substrate, such as a leadframe or printed circuit board (PCB). In semiconductor packages using a leadframe, the leadframe is the central supporting structure of the semiconductor package. A portion of the leadframe is internal to the package, i.e., completely surrounded by an encapsulant.

For purposes of high-volume, low-cost production of semiconductor packages, a current industry practice is to etch or stamp a thin sheet of metal material to form a panel or strip that defines multiple leadframes. A single strip may be formed to include multiple arrays, with each such array including a multiplicity of leadframes in a particular pattern. In a typical semiconductor package manufacturing process, the integrated circuit dies are mounted and wire bonded to respective ones of the leadframes, with the encapsulant material then being applied to the strips to encapsulate the integrated circuit dies, bond wires, and portions of each of the leadframes.

Varieties of techniques are known for interconnecting an integrated circuit die to a substrate. These techniques include wire bonding, tape automated bonding (TAB), and flip chip bonding. In wire bonding, a bond pad on an integrated circuit die is attached to a contact on a substrate or other microelectronic component. In the case of leadframes as substrates, the contact is referred to as a lead finger. In forming the wire bond, a bonding wire is fed through a capillary, which is guided under computer control. A ball of molten wire is formed at the tip of the wire. The ball is then pressed against the bond pad of the integrated circuit die or the contact of the substrate, forming a "ball bond." Most commonly, the ball bond is formed on the bond pad of the integrated circuit die rather than on the contact of the substrate.

The other end of the bonding wire typically is attached to the contact of the substrate using a "stitch bond." In a stitch bond, ultrasonic energy is delivered to the wire through the capillary as the capillary presses the wire against the contact of the substrate. A bonding head carrying the capillary is retracted to leave a wire tail at the stitch. Thereafter, a wire clamp carried by the bonding head is closed, tearing the wire as the bonding head retracts further.

In conventional chip-on-board (COB) structures, an integrated circuit chip or other microelectronic component is attached to a substrate with the active surface of the microelectronic component facing outwardly away from the substrate. The back surface of the microelectronic component is adhesively bonded to the substrate. The bond pads on the microelectronic component may then be wire bonded to lead fingers or contacts arranged on the surface of the substrate to electrically couple the microelectronic component to the substrate. The bonding wire may extend laterally outwardly away from a stitch bond rather than generally perpendicularly outwardly, as is the case in a ball bond. The minimum height of a stitch bond, consequently, can be significantly smaller than a ball bond, being limited primarily by the thickness of the bonding wire.

As the trend toward smaller semiconductor packages increases, there is a need for higher wire density in a semiconductor package. Bond pads on the integrated circuit die have been formed smaller than or equal to about 45 microns to increase density, but there has been difficulty in manufacturing a leadframe with fine pitch lead fingers. Consequently, lead fingers have remained at a width of about 90 microns to accommodate the tolerances involved in stitch bonding bond wires to the lead fingers. Additionally, the upper surfaces of the lead fingers are not always flat thereby making it difficult to perform a stitch bond onto the lead fingers. Accordingly, there has been no acceptable solution for manufacturing a semiconductor package having lead fingers on a leadframe with a fine pitch.

Solutions to these problems have been long sought but prior developments have not taught or suggested any solutions and, thus, solutions to these problems have long eluded those skilled in the art.

DISCLOSURE OF THE INVENTION

The present invention provides a method of manufacturing a semiconductor package system including: providing a die having a contact pad; providing a lead finger having a substantially trapezoidal cross-section; attaching a bump to the lead finger, the bump clamped on a top and a side of the lead finger; connecting the bump to the contact pad; and forming an encapsulant over the lead finger and the die, the encapsulant leaving a bottom of the lead finger exposed.

The present invention provides a semiconductor package system including: a die having a contact pad; a lead finger having a substantially trapezoidal cross-section; a bump clamped on a top and a side of the lead finger, the bump connected to the contact pad; and an encapsulant over the lead finger and the die, the encapsulant with a bottom of the lead finger exposed.

Certain embodiments of the invention have other advantages in addition to or in place of those mentioned above. The advantages will become apparent to those skilled in the art from a reading of the following detailed description when taken with reference to the accompanying drawings.

BEST MODE FOR CARRYING OUT THE INVENTION

Figure 1:
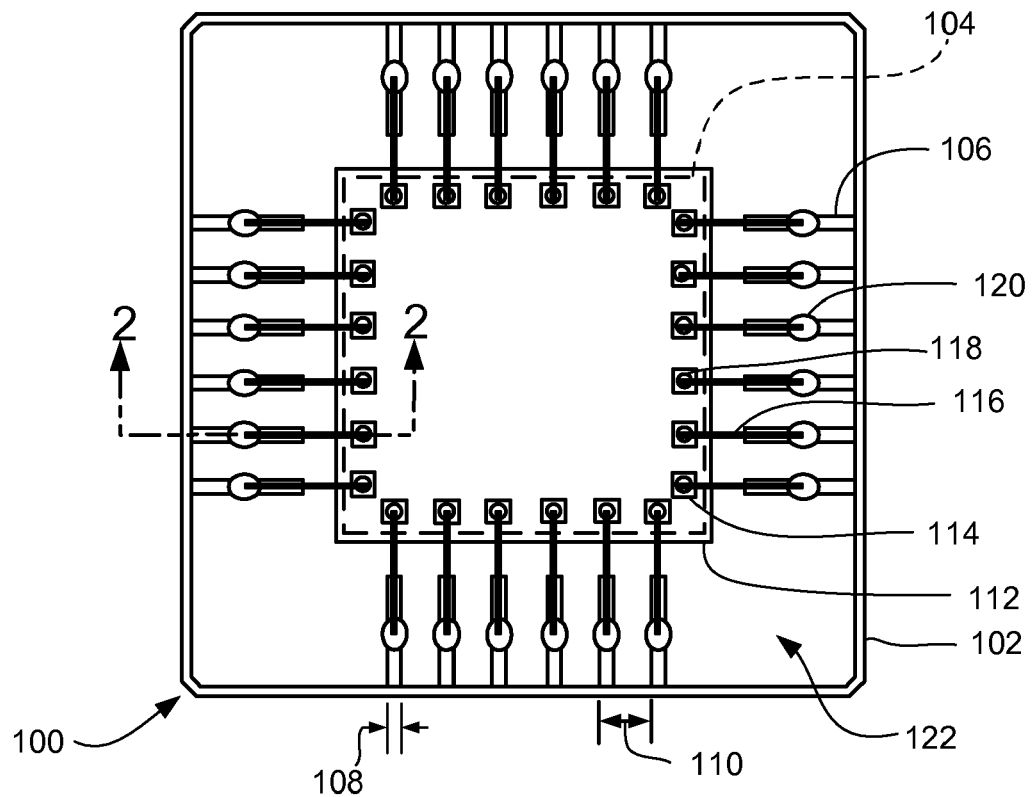
FIG. 1 is a plan view of a semiconductor package system manufactured in accordance with an embodiment of the present invention.

In the following description, numerous specific details are given to provide a thorough understanding of the invention. However, it will be apparent that the invention may be practiced without these specific details. In order to avoid obscuring the present invention, some well-known system configurations, and process steps are not disclosed in detail.

Likewise, the drawings showing embodiments of the system are semi-diagrammatic and not to scale and, particularly, some of the dimensions are for the clarity of presentation and are shown greatly exaggerated in the FIGs. Generally, the device can be operated in any orientation. The same numbers will be used in all the drawing FIGs. to relate to the same elements.

The term "horizontal" as used herein is defined as a plane parallel to the conventional plane or surface of the semiconductor package, regardless of its orientation. The term "vertical" refers to a direction perpendicular to the horizontal as just defined. Terms, such as "on", "above", "below", "bottom", "top", "side", "up", "down", "higher", "lower", "over", and "under", are defined with respect to the horizontal plane.

The term "narrow" as used herein with respect to lead fingers means lead fingers having an upper surface of a width less than or equal to about 40 microns. The term "fine pitch" as used herein means a distance les than or equal to about 90 microns between leading edges of adjoining lead fingers in a leadframe.

Referring now to FIG. 1, therein is shown a plan view of a semiconductor package system 100 manufactured in accordance with the present invention. The semiconductor package system 100 includes a leadframe 102, such as a copper (Cu) leadframe. The leadframe 102 includes a die pad 104 and a number of lead fingers 106 located around the periphery of the die pad 104. Each of the lead fingers 106 is a narrow lead finger having a narrow width 108 of less than or equal to about 40 microns. The lead fingers 106 have a fine pitch 110 of less than or equal to about 90 microns measured edge of lead finger to edge of lead finger.

A die 112 is attached to the die pad 104. The die 112 may be attached using a suitable attachment means (not shown), such as an adhesive, an adhesive tape, or other suitable means of attaching the die 112 to the die pad 104.

The die 112 includes a number of contact pads 114 around the periphery of the die 112. The contact pads 114 have a number of bond wires 116 attached with a ball bond 118 formed using conventional wire bonding equipment. The bond wires 116 is attached to the number of lead fingers 106 by forming a number of bumps 120 on the lead fingers 106 and stitch bonding the bond wires 116 to the bumps 120.

An encapsulant 122 is formed to encapsulate the die 112, the lead fingers 106, the bond wires 116, and the lead fingers 106. The encapsulant 122 leaves the lower surfaces of the die pad 104 exposed.

Figure 2:
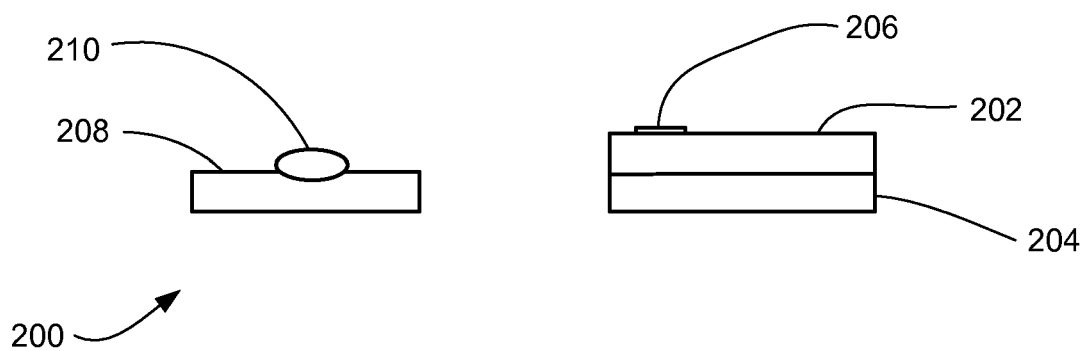
FIG. 2 is an enlarged partial cross-sectional view of the structure of FIG. 1 taken along line 2-2 at an intermediate stage of manufacture.

Referring now to FIG. 2, therein is shown an enlarged partial cross-sectional view of the structure of FIG. 1 taken along line 2-2 at an intermediate stage of manufacture. A wire bond assembly 200 is representative of the number of wire bonds shown in FIG. 1. The wire bond assembly 200 includes a die 202 attached to a die pad 204, such as the die pad 104 shown in FIG. 1 or other substrate. The die 202 has a contact pad 206. The contact pad 206 is representative of the number of contact pads 114 shown in FIG. 1. A lead finger 208 is representative of the number of lead fingers 106 shown in FIG. 1. The lead finger 208 has a bump 210 formed on its upper surface. The bump 210 is representative of the number of bumps 120 shown in FIG. 1.

Figure 3:
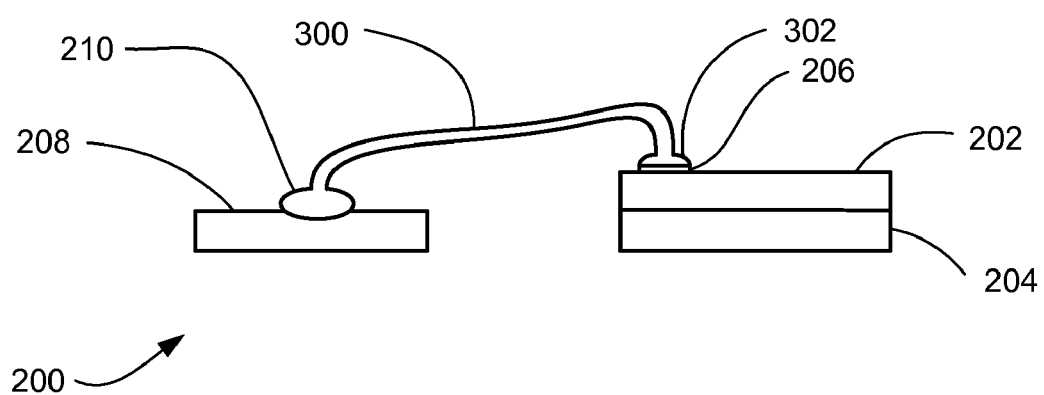
FIG. 3 is the structure of FIG. 2 after wire bonding the die to the lead finger using a forward wire bonding method.

Referring now to FIG. 3, therein is shown the structure of FIG. 2 after wire bonding the die 202 to the lead finger 208 using a forward wire bonding method. A forward bonding method is a wire bonding process by which a bond wire 300 is subjected to ball bonding to the contact pad 206 on the die 202 and to stitch bonding to the bump 210 on the lead finger 208.

The bond wire 300, such as a gold (Au), copper (Cu), aluminum (Al), or other suitable conductor, is bonded to the contact pad 206 on the die 202. The bond wire 300 is connected to the contact pad 206 using a wire bonding apparatus including a capillary (not shown). The capillary is generally cone shaped and has a through hole through which the bond wire 300 is fed. The capillary includes a nose that typically is used to form ball bonds and stitch bonds. A ball is formed at the end of the bond wire 300. The ball is pressed against the contact pad 206. The ball is formed at the end of the wire by heating the tip of the bond wire. As the capillary applies pressure, heat is provided by either heating the capillary or using a light ultrasonic scrubbing action to cause a ball bond 302 to form a bond between the bond wire 300 and the contact pad 206 underneath.

A small length of the bond wire 300 is then fed out of the end of the capillary. The capillary is lowered so that the nose presses a portion of the bond wire 300 against the bump 210 on the lead finger 208. The capillary is ultrasonically vibrated to form a stitch bond, or wedge bond, between the bond wire 300 and the bump 210. Thereafter, the capillary is raised to break the bond wire 300 leaving a stitch bond on the bump 210.

Figure 4:
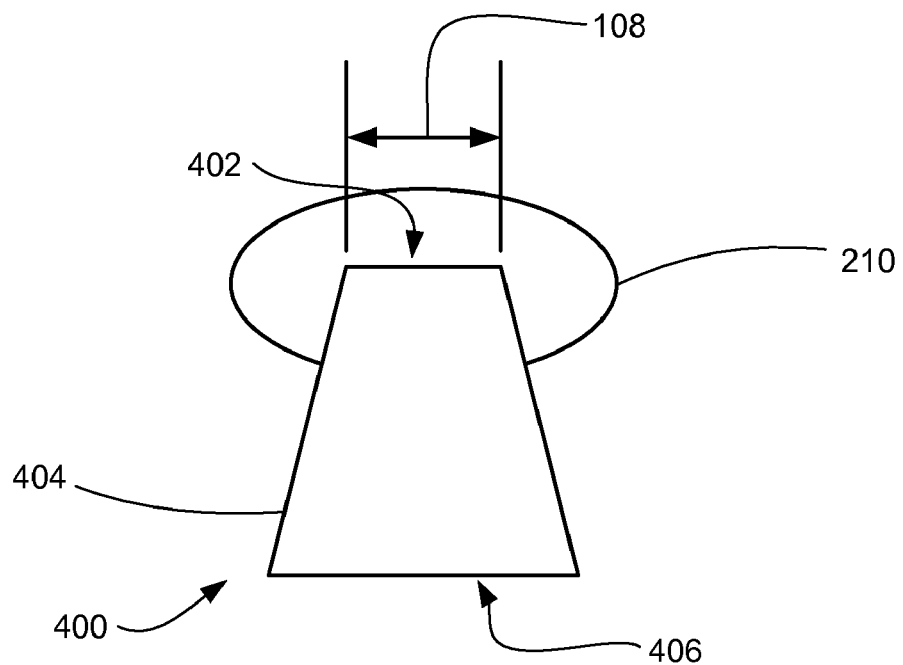
FIG. 4 is an enlarged cross-sectional view of the lead finger shown in FIG. 3 having a flat upper surface in accordance with an embodiment of the present invention.

Referring now to FIG. 4, therein is shown an enlarged cross-sectional view of the lead finger shown in FIG. 3 having a flat upper surface in accordance with an embodiment of the present invention. A lead finger 400 is representative of at least some of the number of lead fingers 106 shown in FIG. 1. The lead finger 400 has a trapezoidal cross-section with a flat upper surface 402. The flat upper surface 402 has the narrow width 108 of less than about 40 microns.

It has been discovered that a secure bond can be formed when the bump 210 covers the flat upper surface 402 and extends laterally beyond the edges of the flat upper surface 402 to clamp to two sides 404 of the lead finger 400 that are slightly sloped so that a base 406 is wider than the flat upper surface 402.

Figure 5:
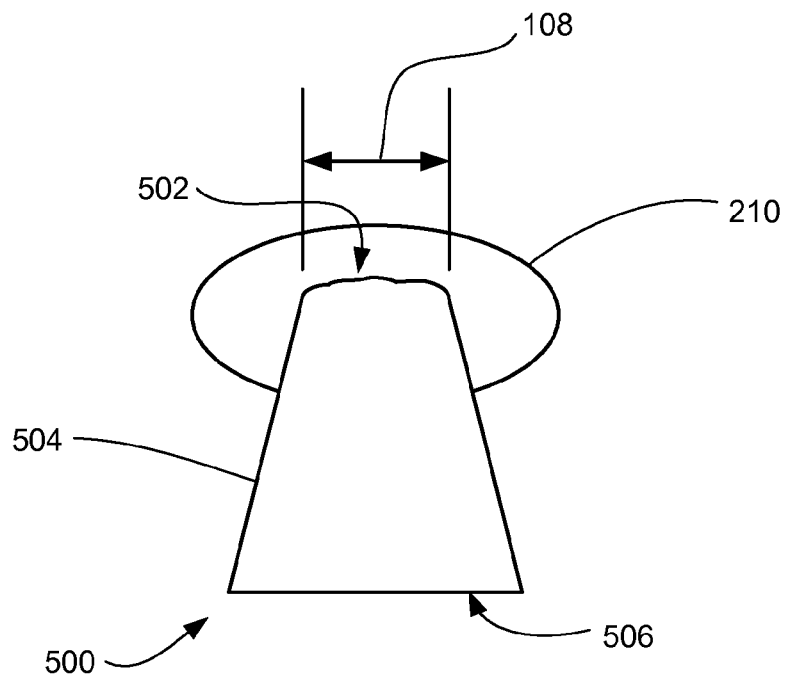
FIG. 5 is an enlarged cross-sectional view of the lead finger shown in FIG. 3 having a non-flat upper surface in accordance with another embodiment of the present invention.

Referring now to FIG. 5, therein is shown an enlarged cross-sectional view of the lead finger shown in FIG. 3 having a non-flat upper surface in accordance with another embodiment of the present invention. A lead finger 500 is representative of at least some of the number of lead fingers 106 shown in FIG. 1. The lead finger 500 has a trapezoidal cross-section with a non-flat upper surface 502. The non-flat upper surface 502 can be jagged, rough, grooved, or other configuration and has the narrow width 108 of less than about 40 microns.

It has been discovered that a secure bond can be formed when the bump 210 covers the non-flat upper surface 502 and extends laterally beyond the edges of the non-flat upper surface 502 to clamp to two sides 504 of the lead finger 500 that are slightly sloped so that a base 506 is wider than the non-flat upper surface 502.

Figure 6:
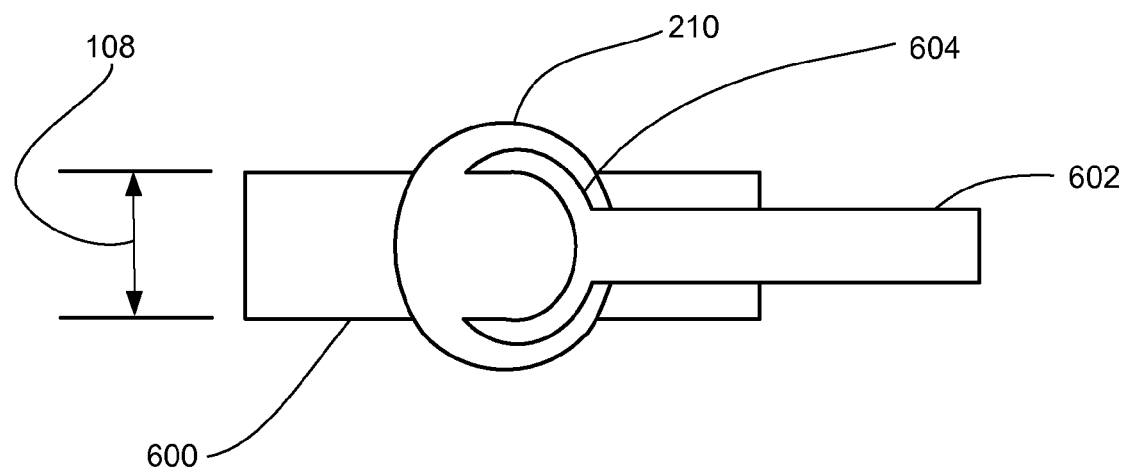
FIG. 6 is an enlarged plan view of a lead finger after performing a stitch bond operation.

Referring now to FIG. 6, therein is shown an enlarged plan view of a lead finger 600 after performing a stitch bond operation as described above in reference to FIG. 3. The lead finger 600 is representative of the number of lead fingers 106 shown in FIG. 1. The lead finger 600 has the narrow width 108 of less than or equal to about 40 microns. The bump 210 has been formed on the lead finger 600. A bond wire 602, which is representative of the number of bond wires 116 shown in FIG. 1 and the bond wire 300 shown in FIG. 3, has been stitch bonded to the bump 210.

It will be appreciated by those skilled in the art upon a reading of this disclosure that the width of a stitch bond 604 is larger than the narrow width 108 of the top of the lead finger 600 preventing stitch bonding of the bond wire 602 directly to the lead finger 600 having the narrow width 108. Additionally, it will be appreciated that due to stitch bond placement error the stitch bond 604 may not be centered over the lead finger 600 on a consistent basis in manufacture thereby also preventing stitch bonding of the bond wire 602 directly to the lead finger 600 having the narrow width 108.

It has been discovered that stitch bonding the bond wire 602 to the lead finger 600 having the narrow width 108 is accomplished using the bump 210 on the lead finger 600 to accommodate the stitch bond 604 resulting in the ability to manufacture a semiconductor package using a leadframe having narrow and fine pitch lead fingers.

Figure 7:
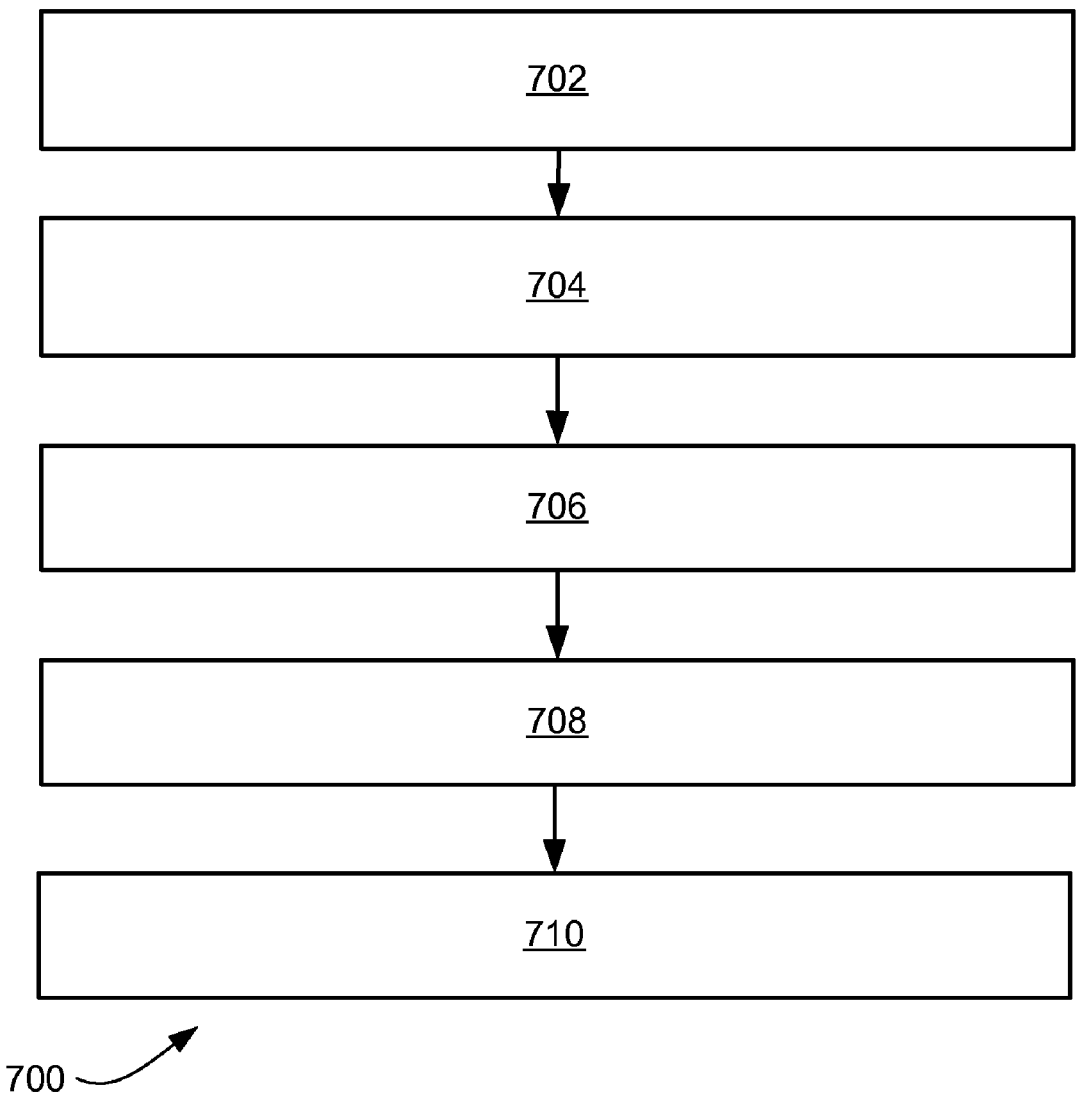
FIG. 7 is a flow chart of a method of manufacturing a semiconductor package system in accordance with an embodiment of the present invention.

Referring now to FIG. 7, therein is shown a flow chart of a method 700 of manufacturing a semiconductor package system in accordance with an embodiment of the present invention. The method 700 includes: providing a die having a contact pad in a block 702; providing a lead finger having a substantially trapezoidal cross-section in a block 704; attaching a bump to the lead finger, the bump clamped on a top and a side of the lead finger in a block 706; connecting the bump to the contact pad in a block 708; and forming an encapsulant over the lead finger and the die, the encapsulant leaving a bottom of the lead finger exposed in a block 710.

Thus, it has been discovered that the system of the present invention furnishes important and heretofore unavailable solutions, capabilities, and functional advantages for manufacturing semiconductor packages. There are an unexpected 40% reduction in wire consumption and a 6% reduction in manufacturing cost. The resulting process and configurations are straightforward, economical, uncomplicated, highly versatile, and effective, use conventional technologies, and are thus readily suited for manufacturing semiconductor devices that are fully compatible with conventional manufacturing processes and technologies.

While the invention has been described in conjunction with a specific best mode, it is to be understood that many alternatives, modifications, and variations will be apparent to those skilled in the art in light of the foregoing description. Accordingly, it is intended to embrace all such alternatives, modifications, and variations that fall within the scope of the included claims. All matters hithertofore set forth herein or shown in the accompanying drawings are to be interpreted in an illustrative and non-limiting sense.

The invention claimed is:

1. A method of manufacturing a semiconductor package system comprising:
   providing a die having a contact pad;
   providing a lead finger having a substantially trapezoidal cross-section;
   attaching a bump to the lead finger, the bump clamping down on a top and a side of the lead finger;
   connecting the bump to the contact pad; and
   forming an encapsulant over the lead finger and the die, the encapsulant leaving a bottom of the lead finger exposed.

2. The method as claimed in claim 1 wherein providing the lead finger provides the lead finger with a top having a flat upper surface.

3. The method as claimed in claim 1 wherein providing the lead finger provides the lead finger with a top having a non-flat upper surface.

4. The method as claimed in claim 1 wherein connecting the bump to the contact pad includes attaching a bond wire between the bump and the contact pad.

5. The method as claimed in claim 1 wherein connecting the bump to the contact pad includes stitch bonding a bond wire to the bump.

6. A method of manufacturing a semiconductor package system comprising:
   providing a die having a contact pad;
   providing a die paddle and a lead finger, the lead finger having a substantially trapezoidal cross-section;
   attaching the die to the die paddle with the contact pad up;
   attaching a bump to the lead finger, the bump clamping down on a top and a side of the lead finger;
   attaching a bond wire between the bump and the contact pad; and
   forming an encapsulant over the lead finger, the die, and the bond wire, the encapsulant leaving a bottom of the lead finger exposed.

7. The method as claimed in claim 6 wherein providing the lead finger provides the lead finger with a top having a flat or non-flat surface.

8. The method as claimed in claim 6 wherein providing the lead finger provides the lead finger with a top having a width less than or equal to about 40 microns.

9. The method as claimed in claim 6 further comprising providing a further lead finger spaced from the lead finger with a fine pitch spacing of less than or equal to about 90 microns.

10. The method as claimed in claim 6 further comprising:
    attaching a bond wire to the contact pad uses ball bonding; and
    attaching the bond wire to the bump uses stitch bonding.

11. A method of manufacturing a semiconductor package system comprising:
    providing a die having a plurality of contact pads;
    forming a leadframe having a plurality of lead fingers, the plurality of lead fingers having a fine pitch and each having a substantially trapezoidal cross-section;
    attaching a plurality of bumps to the plurality of lead fingers, the plurality of bumps on the tops and extending down the sides of the plurality of lead fingers;
    attaching a plurality of bond wires to the plurality of contact pads;
    attaching the plurality of bond wires to the plurality of bumps; and
    forming an encapsulant over the plurality of lead fingers, the die, and the plurality of bond wires, the encapsulant leaving lower surfaces of the plurality of lead fingers exposed.

12. A semiconductor package system comprising:
    a die having a contact pad;
    a lead finger having a substantially trapezoidal cross-section;

the bump clamping down on a top and a side of the lead finger, the bump connected to the contact pad; and an encapsulant over the lead finger and the die, the encapsulant with a bottom of the lead finger exposed.

13. The system as claimed in claim 12 wherein the lead finger has a top with a flat upper surface.

14. The system as claimed in claim 12 wherein the lead finger has a top with a non-flat upper surface.

15. The system as claimed in claim 12 wherein the bump is connected to the contact pad by a bond wire.

16. The system as claimed in claim 12 wherein the bump is connected to the contact pad by a bond wire attached to the bump by a stitch bond.

17. The system as claimed in claim 12 further comprising:
a die paddle having the die attached thereto with the contact pad up;
a bond wire connected between the contact pad and the bump; and
the encapsulant over the bond wire.

18. The system as claimed in claim 17 further comprising a further lead finger having a flat or a non-flat surface.

19. The system as claimed in claim 17 further comprising a further lead finger having a width less than or equal to about 40 microns.

20. The system as claimed in claim 17 further comprising a further lead finger spaced from the lead finger with a fine pitch spacing of less than or equal to about 90 microns.

21. The system as claimed in claim 17 wherein:
the bond wire is attached to the contact pad by a ball bond and to the bump by a stitch bond.

* * * * *